United States Patent
Bennett et al.

(10) Patent No.: US 10,735,025 B2
(45) Date of Patent: Aug. 4, 2020

(54) USE OF DATA PREFIXES TO INCREASE COMPRESSION RATIOS

(71) Applicant: Microsoft Technology Licensing, LLC, Redmond, WA (US)

(72) Inventors: John Grant Bennett, Sammamish, WA (US); Susan Elizabeth Carrie, Mountain View, CA (US); Ravi shankar Reddy Kolli, Sammamish, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 337 days.

(21) Appl. No.: 15/910,573

(22) Filed: Mar. 2, 2018

(65) Prior Publication Data

US 2019/0273508 A1    Sep. 5, 2019

(51) Int. Cl.
*H03M 7/40* (2006.01)
*H03M 7/42* (2006.01)
*G06N 3/08* (2006.01)
*H03M 7/30* (2006.01)
*G06F 16/174* (2019.01)

(52) U.S. Cl.
CPC ...... *H03M 7/4037* (2013.01); *G06F 16/1744* (2019.01); *G06N 3/08* (2013.01); *H03M 7/3086* (2013.01); *H03M 7/42* (2013.01)

(58) Field of Classification Search
CPC .... H03M 7/4037; H03M 7/3086; H03M 7/42; G06F 16/1744; G06N 3/08
USPC .......................................................... 707/693
See application file for complete search history.

(56) References Cited

U.S. PATENT DOCUMENTS

| | | | | |
|---|---|---|---|---|
| 5,406,279 A * | 4/1995 | Anderson | ........... | H03M 7/3086 341/51 |
| 5,951,623 A * | 9/1999 | Reynar | ................... | G06T 9/005 341/106 |
| 6,121,903 A * | 9/2000 | Kalkstein | ............ | H03M 7/3086 341/106 |
| 7,016,547 B1 * | 3/2006 | Smirnov | ................. | H03M 7/40 375/E7.144 |
| 7,693,709 B2 * | 4/2010 | Thumpudi | ............ | G10L 19/008 704/205 |
| 7,724,827 B2 * | 5/2010 | Liang | ..................... | H04N 19/52 341/59 |
| 7,822,601 B2 * | 10/2010 | Mehrotra | .............. | G10L 19/032 341/51 |

(Continued)

*Primary Examiner* — Dung K Chau
(74) *Attorney, Agent, or Firm* — Alleman Hall Creasman & Tuttle LLP

(57) ABSTRACT

A data compression system includes a memory to store a plurality of predetermined prefixes corresponding to a plurality of classes of data. A classifying module is configured to receive data, receive a class of the data, and select a prefix to compress the data from the plurality of predetermined prefixes based on the data and the class of the data. A compressing module is configured to compress the data using the prefix. A header generating module is configured to generate a header including an indication of the prefix used to compress the data, and to output the header and the compressed data for storage or transmission. Using the prefix from the predetermined prefixes to compress the data eliminates an overhead of fetching the prefix from outside the data compression system.

20 Claims, 6 Drawing Sheets

(56) References Cited

U.S. PATENT DOCUMENTS

2013/0297575 A1\* 11/2013 Fallon ..................... G06F 16/22
707/693

\* cited by examiner

USE OF DATA PREFIXES TO INCREASE COMPRESSION RATIOS

FIELD

The present disclosure relates generally to data compression and more particularly to use of data prefixes to increase compression ratios.

BACKGROUND

Data compression ratio is defined as a ratio of uncompressed size to compressed size. Thus if a 4 kilo byte (kB) file is compressed to 400 bytes, the compression ratio is 10 (or ten to one). With the proliferation of the Internet, mobile computing devices, cloud computing, social networks, and so on, large amounts of data are routinely transferred between computing devices via various networks. For example, large amounts of data are routinely exchanged between mobile phones and hosts of service providers via wireless networks. In cloud computing systems, large amounts of data are transferred between datacenters and between hosts within datacenters. In on-premises computing systems of an enterprise, large amounts of data are transferred between computers via various networks.

Further, within a computer, large amounts of data can be transferred between two devices of the computer. For example, large amounts of data can be transferred between a storage device (e.g., a disk drive) and physical memory of the computer, between a processor and physical memory of the computer, between physical memory and a graphics processor of the computer, and so on.

Compressing data can improve bandwidth utilization of the communication media (e.g., networks, buses, and so on) through which the data are transported. Compressed data can be transported faster than uncompressed data. When compression is used, compressed data is decompressed before processing the data.

Data compression is widely used. For example, various content providers that provide content such as streaming videos use data compression. Various applications (called apps) that provide storage for photos, documents, and so on use data compression. Data stored may be telemetry or other databases. Backup applications that backup large amounts of data use data compression.

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

SUMMARY

A system comprises a computer-readable storage device configured to store computer-executable instructions and a processing device configured to execute the computer-executable instructions that, upon execution by the processing device, control the system to receive a class of data to be compressed; and select, based on the class of the data and the data, a prefix from a plurality of predetermined prefixes to compress the data. The processing device is further configured to execute the computer-executable instructions that, upon execution by the processing device, control the system to select, based on the class of the data, the data, and the prefix, a first Huffman table from a plurality of predetermined Huffman tables stored in the storage device to indicate codes associated with compressed data. The processing device is further configured to execute the computer-executable instructions that, upon execution by the processing device, control the system to compress the data using the prefix to produce intermediate symbols. The processing device is further configured to execute the computer-executable instructions that, upon execution by the processing device, control the system to select, based on the intermediate symbols, a second Huffman table from the plurality of predetermined Huffman tables. The processing device is further configured to execute the computer-executable instructions that, upon execution by the processing device, control the system to generate a third Huffman table based on the intermediate symbols. The processing device is further configured to select the compressed data with a first header including indications of the prefix and the first Huffman table, or the compressed data with a first header including indications of the prefix and the second Huffman table, whichever is smaller in size. The processing device is further configured to compare a size of the selected compressed data with the first header including indications of the prefix and the first or second Huffman table with a size of the compressed data with a second header including the third Huffman table and an indication of the prefix. The processing device is further configured to select, to transmit or to store, the compressed data with the second header when the size of the compressed data with the second header is less than the size of the compressed data with the first header, or the compressed data with the first header when the size of the compressed data with the first header is less than the size of the compressed data with the second header.

In other features, the plurality of predetermined prefixes is stored in the storage device; the prefix is cached in the storage device; and/or the prefix is fetched externally relative to the system.

In other features, the prefix is compressed.

In other features, the processing device is further configured to execute the computer-executable instructions that, upon execution by the processing device, control the system to select the prefix from the plurality of predetermined prefixes using a neural network algorithm.

In other features, the processing device is further configured to execute the computer-executable instructions that, upon execution by the processing device, control the system to compress the data using a lossless compression algorithm.

In other features, herein the processing device is further configured to execute the computer-executable instructions that, upon execution by the processing device, control the system to compress the data using LZ77 compression algorithm.

In still other features, a data compression method comprises storing a plurality of predetermined prefixes corresponding to a plurality of classes of data in a memory of a compression module. The method further comprises analyzing data to be compressed, identifying features of the data, receiving a class of the data, and selecting, based on the class of the data and the data, a prefix to compress the data from the plurality of predetermined prefixes stored in the memory of the compression module to eliminate an overhead of fetching the prefix. The method further comprises compressing, using the compression module, the data using the selected prefix to generate compressed data. The method further comprises generating a header including an indication of the selected prefix used to compress the data. The method further comprises outputting, for storage or transmission, the compressed data and the header including the indication of the selected prefix used to compress the data.

In other features, the data compression method further comprises storing a plurality of predetermined Huffman tables corresponding to the plurality of classes of data in the memory of the compression module. The method further comprises selecting, based on the class of the data, the data, and the selected prefix, a first Huffman table from the plurality of predetermined Huffman tables stored in the memory to indicate codes associated with the compressed data. The method further comprises selecting, based on intermediate symbols generated by the compression module, a second Huffman table from the plurality of predetermined Huffman tables. The method further comprises generating a third Huffman table based on the intermediate symbols. The method further comprises including in the header the third Huffman table or an indication of the first or second Huffman table, whichever minimizes the size of the compressed data with the header.

In other features, the prefix is compressed.

In other features, the data compression method further comprises selecting the prefix from the plurality of predetermined prefixes using a neural network algorithm.

In other features, the data compression method further comprises compressing the data using a lossless compression algorithm.

In other features, the data compression method further comprises compressing the data using LZ77 compression algorithm.

In still other features, a data compression system comprises a memory to store a plurality of predetermined Huffman tables corresponding to a plurality of classes of data. The data compression system comprises a classifying module configured to receive data and a class of the data, and to select a Huffman table from the plurality of predetermined Huffman tables based on the class of the data and the data to indicate codes associated with the data after the data is compressed. The data compression system comprises a compressing module configured to compress the data. The data compression system comprises a header generating module configured to generate a header including an indication of the Huffman table, and to output the header and the compressed data for storage or transmission. Using the Huffman table from the plurality of predetermined Huffman tables eliminates an overhead of fetching the Huffman table from outside the data compression system.

In other features, the memory further stores a plurality of predetermined prefixes corresponding to the plurality of classes of data. The classifying module is further configured to select a prefix, from the plurality of predetermined prefixes based on the class of the data and the data, to compress the data.

In other features, the compressing module is configured to compress the data using the prefix and to generate intermediate symbols. The data compression system further comprises a processing module configured to select, based on the intermediate symbols, a second Huffman table from the plurality of predetermined Huffman tables.

In other features, the processing module is further configured to generate a third Huffman table based on the intermediate symbols and to output the third Huffman table or an indication of the Huffman table or the second Huffman table to the header generating module, whichever minimizes the size of the compressed data with the header.

In other features, the prefix is compressed.

In other features, the classifying module is further configured to select the prefix from the plurality of predetermined prefixes using a neural network algorithm.

In other features, the compressing module is further configured to compress the data using a lossless compression algorithm.

In other features, the compressing module is further configured to compress the data using LZ77 compression algorithm.

Further areas of applicability of the present disclosure will become apparent from the detailed description, the claims, and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings.

In the drawings, reference numbers may be reused to identify similar and/or identical elements.

DETAILED DESCRIPTION

Figure 1:
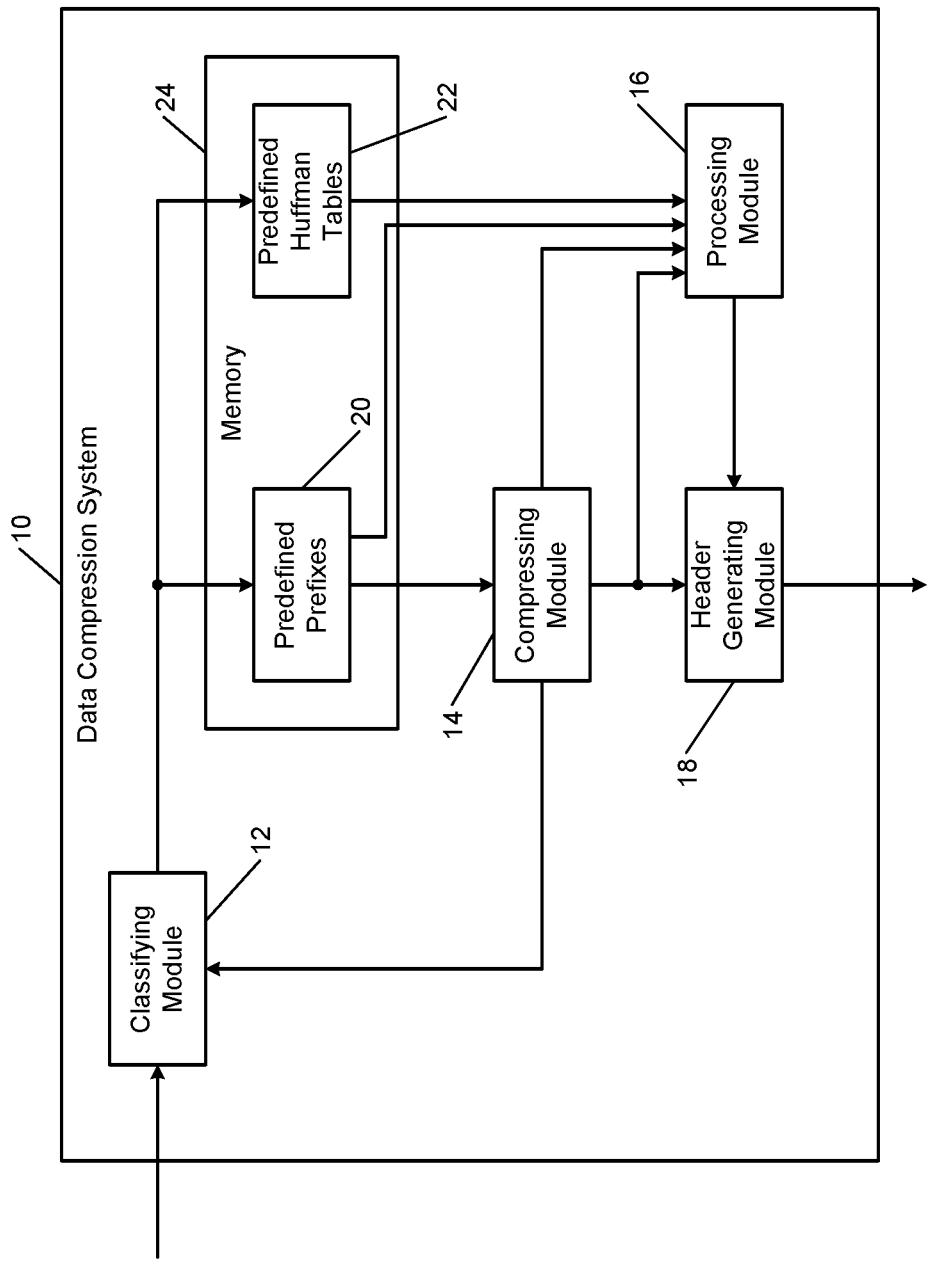
FIG. 1 is functional block diagram of a data compression system according to the present disclosure.

The present disclosure proposes systems and methods for compressing data. While compression is typically used to compress large amounts of data, the systems and methods of the present disclosure, which are described below in detail, are particularly well-suited for compressing smaller amounts of data (e.g., data less than or equal to 4 kB, 8 kB, etc.). Briefly, the systems and methods comprise a classifier that analyzes features of the data to be compressed. There is no restriction on the size of the data which can be compressed. The systems and methods use a subset of an entire data buffer to perform analysis and select a prefix and Huffman table based on the analysis. Typically the size of the data used for analysis is known but could be chosen on the fly. Typically the location of the data is the start of the buffer but it could be at any location or at several locations in the buffer. Accordingly, for example only, the size of the data analyzed for selecting the prefix and the Huffman table may be less than or equal to a predetermined or on the fly selectable size (e.g., 4 kB, 8 kB, etc.). Note that the feature extraction process may extend into any type of next stage analysis including, but not limited to, machine learning. For example, a simple analysis might look for common pronouns and then choose a pronoun filled prefix if <n> pronouns are detected.

Based on the features of the data detected or extracted from the analysis of the data, and based on the class of the data provided by the user, which is identified (extracted) from the analysis of the data, the classifier selects a prefix from a plurality of predetermined prefixes stored in a compression engine to compress the data. Optionally, based on the class of the data and the selected prefix, the classifier also selects a Huffman table from a plurality of predetermined Huffman tables, which are also stored in the compression engine, to indicate codes associated with compressed data. The selected predetermined Huffman table is well-matched to the combination of the class of the data to be compressed and the selected prefix to compress the data. The compression engine then compresses the data using the selected prefix.

A processor analyzes intermediate symbols generated during the compression process. For example, the most common set of symbols represent offsets and lengths where a Lempel-Ziv 77 (LZ77) based algorithm matches to the current text were found. However, the Huffman analysis and optimizations described below could be performed on any symbol alphabet. Note that the intermediate symbols refer to symbols prior to Huffman encoding and are different than the compressed data which typically refers to the data after Huffman encoding.

Based on the analysis of the intermediate symbols, the processor selects a second (different) Huffman table from the plurality of predetermined Huffman tables. This choice can also involve the class which was sent with the data by the user. This allows multiple sets of Huffman tables for different classes of data. For example, one class of Huffman tables (and prefixes) could be targeted towards web pages while another might be targeted towards email messages. The processor also generates a Huffman table (a third table) based on the actual frequencies of the LZ77 matches. Accordingly, at this point, there are three tables: first table, which is the Original selection made based on uncompressed data; second table, which is the next choice made based on intermediate symbols; and third table, which is constructed from the intermediate symbols.

The processor determines whether the size of the compressed data buffer including the compressed data, the prefix indication, and the generated Huffman table is smaller than the size of the compressed data buffer including the compressed data, the prefix indication, and the indication for the initially or later selected Huffman table. The processor transmits the compressed data with a header including indications of the prefix and the first or second Huffman table if the size of the compressed data buffer including the compressed data, the prefix indication, and the generated Huffman table is not smaller than the size of the compressed data buffer including the compressed data, the prefix indication, and the indication for the first or second Huffman table. The processor transmits the compressed data with a header including the generated Huffman table and an indication of the prefix if the size of the compressed data buffer including the compressed data, the prefix indication, and the generated Huffman table is smaller than the size of the compressed data buffer including the compressed data, the prefix indication, and the indication for the first or second Huffman table.

In other words, if the first or second table is selected, the size of the table is referenced in the header. Instead, if the third table is selected, the table is included in the output. Further, the comparison is between the size of the compressed data with the first or second table referenced, and the size of the compressed data with the entire third table.

At a destination where the compressed data and the header are received, when the data is to be used or processed, a decompression engine decompresses the compressed data based on the prefix used to compress the data.

The decompression engine finds the indication of the prefix used to compress the data in the header received with the compressed data. The decompression engine stores the same predetermined prefixes that are used by the compression engine since the predetermined prefixes are predetermined (i.e., mutually agreed upon between the compression and decompression engines) a priori for each class of data. Since the predetermined prefixes are predetermined a priori and are stored in or fetched by both the compression and decompression engines, the prefix used to compress the data is not sent with the compressed data. Instead, an indication of (or a reference to) the prefix used to compress the data is sent in the header of the compressed data to inform the decompression engine as to which prefix was used to compress the data.

In addition, the decompression engine stores or fetches the same predetermined Huffman tables that are stored in the compression engine since the predetermined Huffman tables are also predetermined a priori for each class of data. If the Huffman table generated based on the analysis of the actual frequencies of the LZ77 matches is not transmitted with the compressed data, an indication of (or a reference to) the selected predetermined Huffman table is sent in the header of the compressed data. Based on the indication of the selected prefix and the indication of the selected Huffman table in the header of the compressed data, or based on the generated Huffman table and the indication of the selected prefix included in the header, the decompression engine decompresses the compressed data.

The systems and methods improve data compression in computing systems and as a result improve data storage within the computing systems (i.e., data at rest) and improve communications between the computing systems (i.e., data in motion) in many ways. For example, using the prefix selected from the predetermined prefixes stored in the compression engine to compress the data eliminates the need to fetch the prefix from outside the system comprising the compression engine. Not fetching the prefix from outside the system improves the bandwidth utilization of the communication medium used to transport the data and the compressed data to and from the system.

The compression and decompression engines can alternatively fetch the prefixes instead of storing prefixes. Further, both engines can use a combination of storing and fetching prefixes. For example, both engines can cache prefixes and also fetch prefixes that are not cached. When prefixes are stored, the prefixes may be stored within the compression engine (e.g., in memory associated with the compression engine) or in memory immediately adjoining the other side of the communication medium so as to minimize fetch or acquisition time. Furthermore, the prefixes can also be compressed using any method known to the engines although prefixes are usually small and are not generally highly compressible.

The data compressed using the systems and methods has a higher compression ratio than compression ratios achievable using prefixes other than the predetermined prefixes, particularly for smaller size data (e.g., data less than or equal to 4 kB, 8 kB, etc.). The size of the compressed data using the predetermined prefixes is smaller than using no prefix at all. If any prefix is chosen and the chosen prefix needs to be fed into the compression engine at the expense of some bandwidth, the compression ratio would drop. One of the advantages of the data compression scheme of the present disclosure is that the choice of the prefix is being made by the compression engine and the bandwidth is saved. The data compression according to the present disclosure results in reduced cost for storing data with a higher compression ratio. When the Huffman table generated based on the actual frequencies of the LZ77 matches is transmitted in the header along with the compressed data, it does not erode the gains resulting from the higher compression ratios achieved using the predetermined prefixes. To further minimize the size of the compressed data, after selecting a first prefix and compressing the data using the first prefix, a second prefix of a different size than the first prefix may be selected and the data can be compressed using the second prefix. Then similar size comparisons to those mentioned above can be performed for the data compressed using the second prefix to determine which prefix offers the best (highest) compression ratio, and output the data with the best (highest) compression ratio. These and other aspects of the systems and methods are now described below in further detail.

The present disclosure is organized as follows. Initially, to facilitate and enhance the understanding of the systems and methods described herein and to introduce the terminology and concepts used herein, an overview of data compression is presented. The overview includes a brief discussion of lossless data compression algorithms, a dictionary coder, and Huffman coding. Subsequently, the systems and methods of the present disclosure are described in detail.

Lossless Data Compression Algorithms:

First, lossless data compression algorithms are briefly discussed. LZ77 and LZ78 are lossless data compression algorithms that form the basis of several compression schemes including GIF and DEFLATE algorithms used in PNG and ZIP, for example.

Lz77 Algorithms:

LZ77 algorithms achieve compression by replacing repeated occurrences of data with references to a single copy of that data existing earlier in an uncompressed data stream. A match is encoded by a pair of numbers called a length-distance pair (say L-D pair for the purpose of simplifying this discussion). The L-D pair indicates that each of the next L characters is equal to the characters exactly D characters behind it in the uncompressed data stream. The distance D is also called an offset.

To find matches, an encoder keeps track of some amount of most recent data (e.g., last 2 kB, 4 kB, or 32 kB). A data structure in which this data is held is called a sliding window, which is why LZ77 is sometimes called sliding window compression. The encoder keeps this data to look for matches, and a decoder keeps this data to interpret the matches that the encoder refers to. The larger the sliding window, the longer the encoder may search backwards for creating references.

While encoding, for a search pointer to continue finding matched pairs past the end of the search window, all characters from the first match at offset D and forward to the end of the search window must have matched input. These are the previously encountered characters that comprise a single run unit of length $L_R$, which must equal D. Then as the search pointer proceeds past the search window and forward, as far as a run pattern repeats in the input, the search and input pointers will be in sync and match characters until the run pattern is interrupted. Then L characters have been matched in total, L>D, and the code is [D, L].

Upon decoding [D, L], again, D=$L_R$. When the first $L_R$ characters are read to an output, this corresponds to a single run unit appended to an output buffer. At this point, a read pointer could be thought of as only needing to return int(L/$L_R$) (+1 if L mod $L_R$≠0) times to the start of that single buffered run unit, read $L_R$ characters (or maybe fewer on the last return), and repeat until a total of L characters are read. By mirroring the encoding process, since the pattern is repetitive, the read pointer need only trail in sync with a write pointer by a fixed distance equal to the run length $L_R$ until L characters have been copied to the output in total.

Lz78 Algorithms:

LZ78 algorithms, which are not discussed in detail, achieve compression by replacing repeated occurrences of data with references to a dictionary that is built based on the input data stream.

Dictionary Coder:

Next, a dictionary coder is briefly explained. A dictionary coder, also sometimes called a substitution coder, is a class of lossless data compression algorithms that operate by searching for matches between data to be compressed and a set of strings contained in a data structure (called a dictionary) maintained by an encoder. When the encoder finds a match for a string, the encoder substitutes a reference to a position of the string in the data structure.

Some dictionary coders use a static dictionary whose full set of strings is determined before coding begins and does not change during the coding process. This approach is most often used when a message or a set of messages to be encoded is fixed and is relatively large in size. For example, an application that stores contents of a book in a limited storage space (e.g., of a tablet, smartphone, etc.) generally builds a static dictionary from a concordance of the text and then uses that dictionary to compress verses in the book.

In a related and more general method, a dictionary is built from redundancy extracted from a data environment (various input streams). The dictionary is then used statically to compress a further input stream. For example, a dictionary is built from old English texts and is then used to compress a book. In more common methods, the dictionary starts in some predetermined state but the contents change during the encoding process based on the data that has already been encoded. Both LZ77 and LZ78 algorithms work on this principle. As mentioned above, in LZ77, a circular buffer called a sliding window holds the last N bytes of data processed. The sliding window serves as a dictionary effectively storing every substring that has appeared in the past N bytes as dictionary entries. Instead of a single index identifying a dictionary entry, two values are needed: a length, indicating a length of the matched text; and an offset (also called a distance), indicating that the match is found in the sliding window starting offset number of bytes before the current text.

One of the disadvantages of dictionary coder is the need for additional symbols to encode matches. A special symbol is needed to distinguish regular matches vs. dictionary matches. In contrast, according to the present disclosure, since the prefix is prepended to the input, prefix matches do not need this special symbol. Another advantage of the prefixes according to the present disclosure over the dictionaries is that the dictionaries require a type of processing and searching which is not compatible with systolic array or some other LZ77 based hardware implementations. Thus, the processing and searching associated with the dictionaries require additional design and verification work, which the prefixes do not.

Huffman Coding:

Next, Huffman coding is briefly explained. A Huffman code is a type of prefix code used for lossless data compression. The output from Huffman's algorithm can be viewed as a variable-length code table for encoding a source symbol (such as a character in a file). The algorithm derives this table from estimated probability or frequency of occurrence (weight) for each possible value of the source symbol.

As in other entropy encoding methods, more common (i.e., more frequently occurring) symbols are generally represented using fewer bits than less common (i.e., less frequently occurring) symbols.

When decompression is performed, the prefix used during compression is presented to the decompression engine. The prefix will once again be used to initialize a search window buffer and any other data structures used by the decompressor.

One approach is to prepend a frequency count of each character to the compression stream. Unfortunately, the overhead in such a case could amount to several kilobytes, which can be undesirable. The overhead depends on the size of the alphabet and the size of the window size. For example, encoding using 64 KB window size and alphabet size of 1000 requires 2 KB to transmit frequencies. Each symbol requires 16 bits (to encode offset up to 64 KB) and since there are a total of 1000 symbols, total overhead is 1000*6 bits=2 KB. Another method is to simply prepend the Huffman tree bit by bit to the output stream. For example, suppose that a value of 0 represents a parent node and a value of 1 represents a leaf node. Whenever the latter is encountered, a tree building routine reads next 8 bits to determine a character value of that particular leaf. The process continues recursively until the last leaf node is reached. At that point, the Huffman tree is faithfully reconstructed. The overhead of using such a method ranges from roughly 2 to 320 bytes (assuming an 8-bit alphabet). Many other techniques are possible as well.

In any case, since the compressed data can end on any bit boundary, the decompression engine should be able to determine when to stop producing output. This can be accomplished by transmitting the length of the decompressed data along with the compression model or by defining a special code symbol to indicate end of input. The probabilities used to predict character frequencies can be generic based on average experience for the application domain or can be actual frequencies found in the text being compressed, which requires storing a frequency table with the compressed text.

The systems and methods of the present disclosure are now described in detail. To optimize lossless data compression ratios at high speeds, various approaches can be used. For example, dictionaries can be used. However, dictionaries require special symbols to reference entries, which increase the number of symbols. Further, dictionaries are relatively small in number. Alternatively, user-defined prefixes (e.g., as in snappy compression standard) can be used. However, the compression engine has to fetch these prefixes, which adds overhead to the compression process. In addition, the user needs to maintain information which indicates which user prefix was used.

Instead, the present disclosure optimizes lossless data compression ratios at high speeds using the following approach. The compression engine preloads a compression window with known data. When compressing a buffer, the compression engine refers to this data but does not include it in the compressed output. Instead, a reference to the buffer can be stored as metadata or in a compression header. A number of prefixes can be predefined so that the compression engine can store them internally instead of fetching them externally. The compression engine can select a prefix from the stored predefined prefixes to compress the data. For example, the compression engine can select the prefix using an algorithm such as a neural network or other suitable algorithm.

Typically, compression engines fetch uncompressed data and return data that is compressed in a known format. In lossless compression, LZ77 approaches described above use a search window. A database is maintained which describes the data in the search window in a way that allows it to be searched as subsequent data arrives. The present disclosure augments this process as follows.

A prefix is read and processed to fill in the search window database used by the compression engine. After the prefix is loaded, the uncompressed data is processed. Any matches found in the prefix data can be placed into the buffer, which reduces the size of the compressed data. The prefix itself is not returned as part of the compressed buffer.

This compression scheme proposed in the present disclosure is most useful for smaller uncompressed data buffers. For example, a 4 kB uncompressed buffer would compress to 490 bytes. Suppose a buffer contains many occurrences of the strings: 'From:', 'To:', 'CC:', 'Subject:'. Using a prefix allows the first occurrence of these strings to be replaced with, for example, 7B Huffman symbols after Huffman encoding. The first occurrence of these symbols would then take 28B instead of 20B. This is a savings of 3.3%.

To realize the savings from using a prefix, the compression engine typically needs to fetch considerable extra data. This is undesirable if the bandwidth available to the compression engine is limited. There are some prefixes which may be applicable across a wide variety of users and applications. The penalty for fetching the data can be eliminated by including predefined prefixes in the compression engine or by caching/storing them close to the compression engine. Prefixes can be stored within the compression engine even if they are not cached/stored close to the compression engine.

Some users may have their own prefix or know which predefined prefix to use. However, both approaches require the user to understand that a prefix is being used and to select or provide a prefix. Instead, as proposed in the present disclosure, users can benefit from the use of a prefix without being burdened with making a choice of prefix. The use of the prefix then becomes transparent to the user. In this case, the compression engine can use any algorithm to select a prefix from the predefined prefixes stored within the compression engine. For example, the compression engine can use algorithms including neural networks or other suitable scoring algorithms.

To select a prefix to compress data, a classifier analyzes the data to be compressed and using a provided class of the data. For example, the classifier determines whether the data involves emails, plain text (e.g., a book or a document), numbers, graphics data, spreadsheets, etc. The classifier essentially determines if there is any string in the data that can be leveraged to eliminate duplicity and to compress the data using a suitable prefix that matches the string. The classifier selects a prefix from the class of predefined prefixes stored within the compression engine such that the selected prefix is a good match for the data to be compressed. The classifier also selects a Huffman table from a set of predefined Huffman tables stored within the compression engine. The classifier selects a predefined Huffman table such from the class of predefined Huffman tables such that the selected predefined Huffman table is well matched to the combination of the selected prefix and the data to be compressed. Predefined Huffman table eliminates the overhead to communicate either the frequencies or the bit lengths between the compressor and decompressor engines. Instead of transmitting frequencies or bit lengths, only an index of the predefined Huffman table is stored in the header, which also saves space on the storage medium.

In the above approaches, it is possible that the use of a prefix does not result in a smaller compression ratio (i.e., no matches are found in the prefix buffer). In such a case, it is possible for the compression engine to return this information to the user so that the overheads associated with using a prefix (processing time and bandwidth to fetch the prefix) are not incurred on the decompression end.

When decompression is performed, the prefix used during compression needs to be presented to the decompression engine. The prefix will again be used to initialize a search window buffer and any other data structures used by the decompression engine. The decompression engine returns decompressed data.

Essentially, compression schemes such as LZ77 use context compiled from prior portions of a rather large file to define prefixes that are used to compress subsequent data in the large file. In contrast, since the present disclosure targets compressing relatively smaller files where overheads can quickly erode compression gains, a classifier selects and supplies to the compression engine an artificial context—a predefined prefix—based on the observed data in a small file, which is then used to compress the small file to achieve high compression ratios.

In some instances, a user can provide its own predefined prefixes suitable for its data in an ad hoc manner (i.e., before sending the data for storage or transmission). These user supplied predefined prefixes are stored in the compression engine in an ad hoc manner (e.g., when a virtual machine is being created and setup for the user and before beginning to receive user data). The user supplied prefixes have the same storage and fetching options as those listed previously for prefixes. Thereafter, when the data to be compressed is normally received from the user, the classifier selects one of the predefined prefixes stored in the compression engine without any user interaction or user input regarding the selection of the prefix. Accordingly, the subsequent selection and use of the stored prefixes to compress the data are transparent to or encapsulated from the user that supplied the prefixes in the ad hoc manner. The user simply provides the data, and the compression engine selects a prefix from the stored predefined prefixes (whether supplied by the user in an ad hoc manner, created by the compression engine independently of any user input, or a combination of both) and compresses the data using the selected prefix without the user realizing the same.

The compression engine and the predefined prefixes stored in the compression engine can be used to compress data that can be stored in the compressed form to optimize storage space or can be transmitted in the compressed form over a communication medium to optimize the bandwidth of the communication medium. Thus, the compression engine and the predefined prefixes stored in the compression engine can be implemented in a variety of applications including but not limited to a storage controller (e.g., an SSD controller), a communication interface (e.g., an Ethernet controller), and so on.

A Huffman table allows optimally selecting symbol length (e.g., 2 bits, 3 bits, etc.) according to frequency of symbols, resulting in a better compression by using optimum number of bits for each symbol. There can be a one-to-one correspondence between a class of data, a prefix, and a Huffman table. That is, the classifier can select a matched pair of a predefined prefix and a predefined Huffman table for a class of data to be compressed. In some implementations, the selected Huffman table can be optimized as follows.

In one example, another predetermined Huffman table (referred throughout the disclosure as a second Huffman table) can be selected based on the intermediate symbols which are to be Huffman encoded if this other Huffman table results in a smaller compressed data buffer than the initially selected predetermined Huffman table (at the time of selecting the prefix). The size comparisons of compressed data buffers with different Huffman tables are described multiple times throughout the disclosure and are therefore omitted for brevity. In this example, an indication of the prefix used to compress the data and an indication of the selected Huffman table (either the initially or the later selected, whichever results in a smaller compressed data buffer) are included in a header associated with the compressed data.

In another example, a Huffman table (referred to throughout the disclosure as a third Huffman table) is generated based on the actual frequencies of the LZ77 matches. If the generated Huffman table results in a smaller compressed data buffer than the initially or the later selected Huffman table, the generated Huffman table and an indication of the prefix used to compress the data are included in the header. The size comparisons of compressed data buffers with different Huffman tables are described multiple times throughout the disclosure and are therefore omitted for brevity.

Further, the predefined and derived (i.e., generated) Huffman tables can be mixed as follows. The first <n> Huffman encodings would be chosen based on the intermediate symbols. The next <i> Huffman encodings would be predetermined. If one of the <i> encodings already appear in the set of <n> encodings it would not be included. This would allow a reduction in the size of the Huffman table while maintaining the most optimal use of the shortest Huffman codes.

FIG. 1 shows a data compression system 10 according to the present disclosure. The data compression system 10 comprises a classifying module 12, a compressing module 14, a processing module 16, and a header generating module 18. The compressing module 14 stores predefined prefixes 20 and predefined Huffman tables 22 in a memory 24 associated with the compressing module 14. One or more modules may be combined into a single module.

The terms predefined and predetermined are used interchangeably and synonymously throughout the disclosure to mean determined a priori or in an ad hoc manner and mutually agreed upon in advance between the compressing and decompressing engines or modules.

Figure 2:
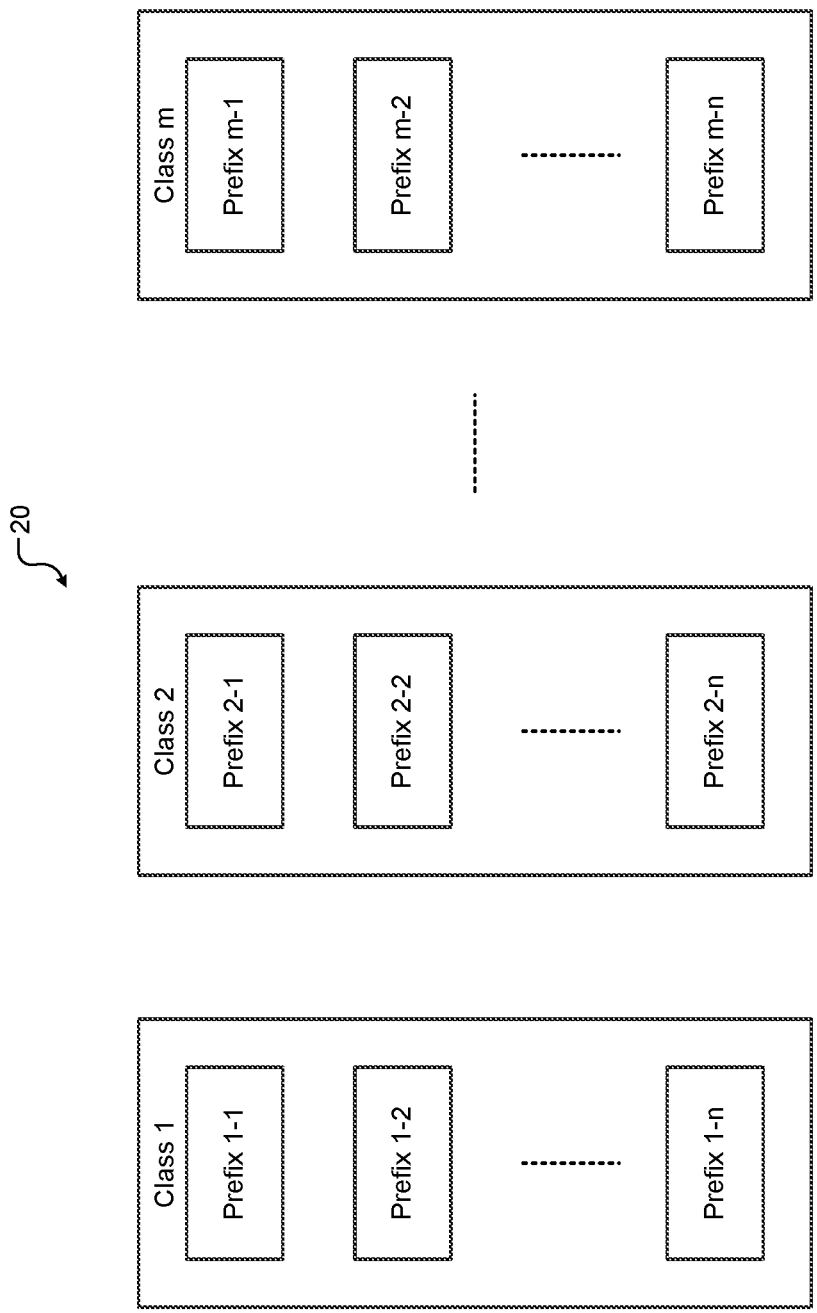
FIG. 2 shows an example of predefined prefixes according to the present disclosure.

FIG. 2 shows an example of the predefined prefixes 20. The predefined prefixes 20 comprise several sets of prefixes for several classes of data. When a user supplies predefined prefixes that are suitable for its data, the user supplied predefined prefixes are also stored in the memory 24 along with the predefined prefixes 20. For example, one or more of the sets of prefixes may include a set of predefined prefixes supplied by the user. In some implementations, the user supplied prefixes may also be appended to one or more of the sets of prefixes. Thus, a prefix to compress data may be selected from a pool of system-generated as well as user-supplied predefined prefixes (collectively shown as predefined prefixes 20) stored in the memory 24.

Figure 3:
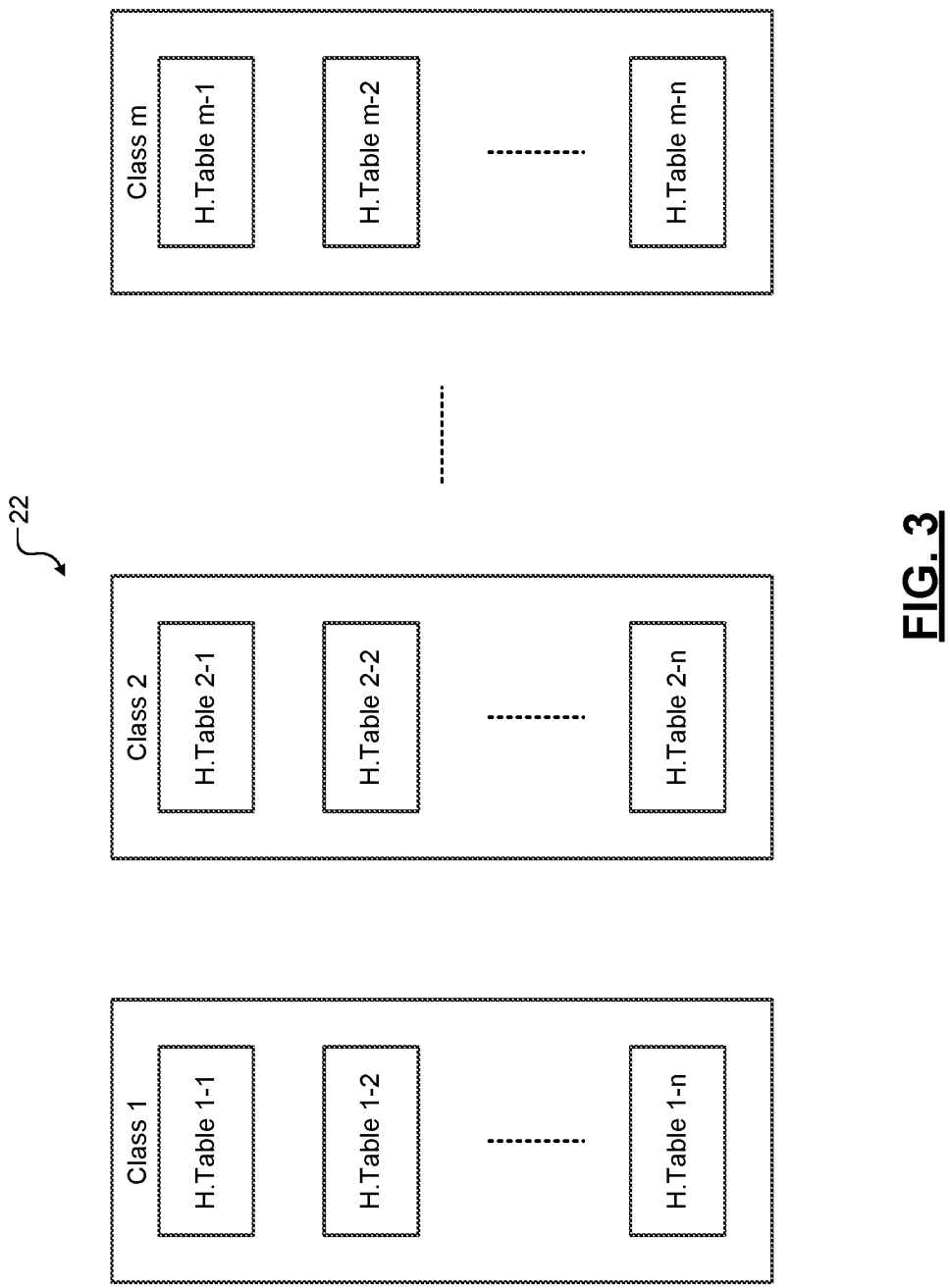
FIG. 3 shows an example of predefined Huffman tables according to the present disclosure.

FIG. 3 shows an example of the predefined Huffman tables 22. The predefined Huffman tables 22 comprise several sets of Huffman tables for the several classes of data. In some implementations, for a particular class of data, the number of Huffman tables may be more than the number of prefixes.

The classifying module 12 receives the data to be compressed. For example, the data to be compressed may be less than or equal to a predetermined size (e.g., 4 kB). The classifying module 12 analyzes a portion of the data to be compressed and uses the class of the data to be compressed sent from the user to choose the set of prefixes which are candidates. Based on the class of the data and the data, the classifier selects a predetermined prefix from the predetermined prefixes 20 that is suitable to compress the data. Based on the class of the data, the data, and the selected prefix, the classifying module 12 also selects an initial predefined Huffman table from the predefined Huffman tables 22. The compressing module 14 compresses the data (i.e., encodes the intermediate symbols) using the selected predefined prefix.

Based on the intermediate symbols, the processing module 16 determines whether to select a second Huffman table from the predefined Huffman tables 22 that to determine if the second Huffman table will produce a smaller compressed buffer (i.e., compressed data plus header) than the initially selected Huffman table. The processing module 16 selects a second Huffman table from the predefined Huffman tables 22 if the processing module 16 finds a second Huffman table that produces a smaller compressed buffer than the initially selected Huffman table.

Based on the actual frequencies of the LZ77 matches, the processing module 16 also generates a Huffman table. The processing module 16 determines whether the generated Huffman table produces a smaller compressed buffer (i.e., compressed data plus header) than the initially or later selected predetermined Huffman table. The processing module 16 also determines whether including the generated Huffman table in a header associated with the compressed data will erode any gains derived from compressing the data using the selected predetermined Huffman table.

The processing module 16 provides the generated Huffman table to the header generating module 18 if including the generated Huffman table in the header will not erode any gains derived from compressing the data using the selected predetermined Huffman table. The processing module 16 provides to the header generating module 18 an indication regarding the initially or later selected predefined Huffman table if including the generated Huffman table in the header will erode any gains derived from compressing the data using the selected predetermined Huffman table.

Essentially, the processing module 16 compares the size of the compressed data with the header including indications of the prefix and the first and second Huffman table to the size of the compressed data with the header including the generated Huffman table and the indication of the prefix, and selects the smallest of the three combinations. In other words, the processing module 16 compares the size of the compressed data with the header 26-1 to the size of the compressed data with the header 26-2 (both shown in FIG. 4), and selects the smaller of the three combinations.

Further, as explained above, the compressing module 14 can also select another prefix of a different size to carry out the above processing in conjunction with the processing module 16. The processing module 16 can then determine which compressed data (i.e., data compressed using which prefix) to output based on the comparisons explained above.

The header generating module 18 generates a header for the compressed data. The header and the compressed data are stored in a storage device (if compressing data at rest) or are transmitted over a communication medium (if compressing data in motion). The contents of the header are described below in detail.

Figure 4:
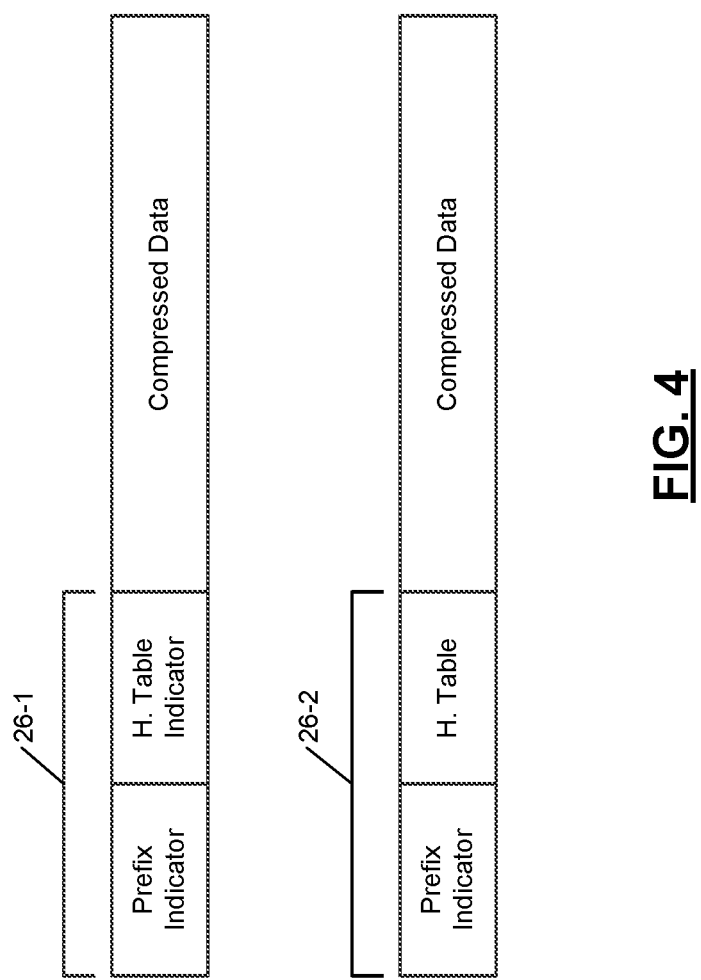
FIG. 4 shows examples of a header for compressed data generated by the data compression system according to the present disclosure.

FIG. 4 shows two examples of the header generated by the header generating module 18. A first header 26-1 includes an indicator (or a reference) indicating the predetermined prefix used to compress the data and an indicator (or a reference) indicating the initially or later selected predefined Huffman table that is well-matched to the class of the data and to the predefined prefix used to compress the data. The header generating module 18 generates the first header 26-1 if including the generated Huffman table (i.e., the Huffman table generated based on the actual frequencies of the LZ77 matches) in the header will erode any gains derived (i.e., will significantly lower the compression ration achieved) from compressing the data using the selected predetermined Huffman table.

A second header 26-2 includes the Huffman table generated based on the actual frequencies of the LZ77 matches and an indicator (or a reference) indicating the predetermined prefix used to compress the data. The header generating module 18 generates the first header 26-1 if including the generated Huffman table (i.e., the Huffman table generated based on the actual frequencies of the LZ77 matches) in the header will not erode any gains derived (i.e., will not significantly lower the compression ration achieved) from compressing the data using the selected predetermined Huffman table.

Figure 5:
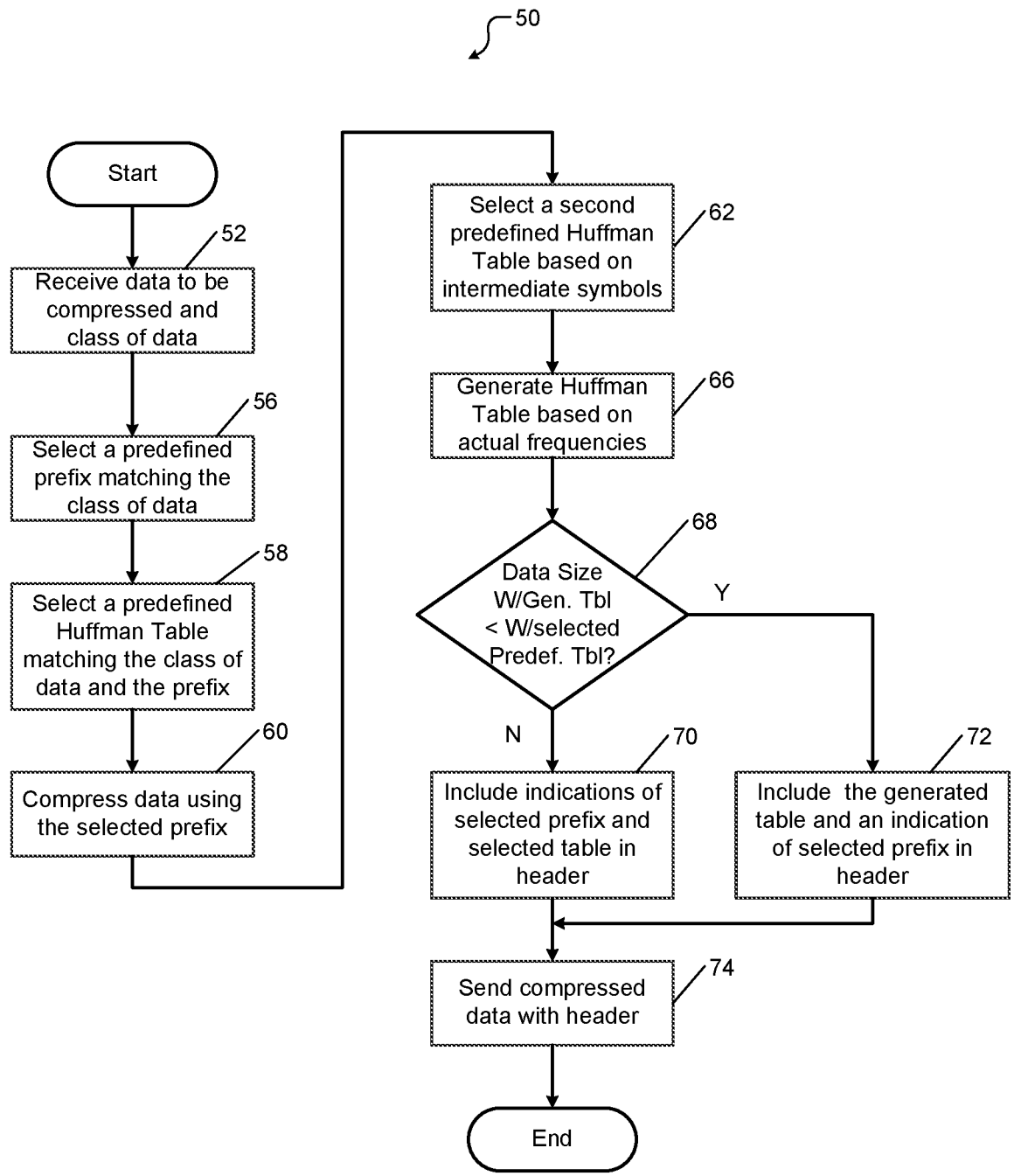
FIG. 5 is a flowchart of a data compression method for compressing data according to the present disclosure.

FIG. 5 shows a data compression method 50 for compressing data according to the present disclosure. The term control as used below refers to instructions (code) executed and operations performed by one or more elements of the data compression system 10. At 52, control (e.g., the classifying module 12 shown in FIG. 1) receives data to be compressed and the class of data sent by the user in the command.

At 56, control (e.g., the classifying module 12) selects a predetermined prefix from a plurality of predetermined prefixes associated with the class of data (e.g., predetermined prefixes 20 shown in FIG. 1) stored within (e.g., in a memory associated with) a compression engine (e.g., the compressing module 14 shown in FIG. 1).

At 58, control (e.g., the classifying module 12) also selects a predetermined Huffman table, which is the best match for the selected predetermined prefix or is the best match for the data to compress the data, from a plurality of predetermined Huffman tables associated with the class of data (e.g., predetermined Huffman tables 22 shown in FIG. 1) stored within (i.e., in a memory associated with) the compression engine (e.g., the compressing module 14).

At 60, control (e.g., the compressing module 14) compresses the data using the selected predefined prefix. At 62, control (e.g., the processing module 16 shown in FIG. 1) selects a second predetermined Huffman table based on the intermediate symbols.

At 66, control (e.g., the processing module 16) generates a Huffman table based on the actual frequencies of the LZ77 matches. At 68, control (e.g., the processing module 16) determines whether the size of the compressed data buffer including the compressed data, the generated Huffman table, and an indication of the prefix is smaller than the size of the compressed data buffer including the compressed data, the indication for the prefix, and the indication for the initially or later selected predefined Huffman table.

At 70, if the size of the compressed data buffer including the compressed data, the generated Huffman table, and the indication of the prefix is not smaller than the size of the compressed data buffer including the compressed data, the indication for the prefix, and the indication for the initially or later selected predefined Huffman table, control (e.g., the header generating module 18 shown in FIG. 1) generates a header (e.g., the first header 26-1 shown in FIG. 4) including indications of the selected predetermined prefix and the initially or later selected predetermined Huffman table.

At 72, if the size of the compressed data buffer including the compressed data, the generated Huffman table, and the indication of the prefix is smaller than the size of the compressed data buffer including the compressed data, the indication for the prefix, and the indication for the initially or later selected predefined Huffman table, control (e.g., the header generating module 18) generates a header (e.g., the second header 26-2 shown in FIG. 4) including the generated Huffman table and an indication indicating the selected predetermined prefix. At 74, control sends the compressed data with the header generated at 70 or 72 for storing the compressed data with the header in a storage device or for transmitting the compressed data with the header over a communication medium.

It should be noted that the compression scheme of the present disclosure can operate by only selecting a prefix (i.e., without selecting a Huffman table), only selecting a Huffman table (i.e., without selecting a prefix), or by selecting both the prefix and the Huffman table.

The data compression system 10 and the data compression method 50 provide many improvements in the technological field of data compression and consequently improve the operation of computing devices utilizing compression. For example, using the prefix from the predetermined prefixes stored in the compression engine to compress the data eliminates the overhead of fetching the prefix from outside the data compression system 10. The compressed data generated using the selected predefined prefix has a higher compression ratio compared to using prefixes other than the predetermined prefixes or not using any prefix at all to compress the data. While there could be other prefixes (for example, something provided by the user) which did provide a high compression ratio, the cost is the size of those prefixes and/or the need to choose them. Further, transmitting or storing the generated Huffman table in a header associated with the compressed data when the generated Huffman table is smaller than the initially or later selected Huffman table does not significantly lower the compression ratio when transmitting or storing the compressed data with the header.

Figure 6:
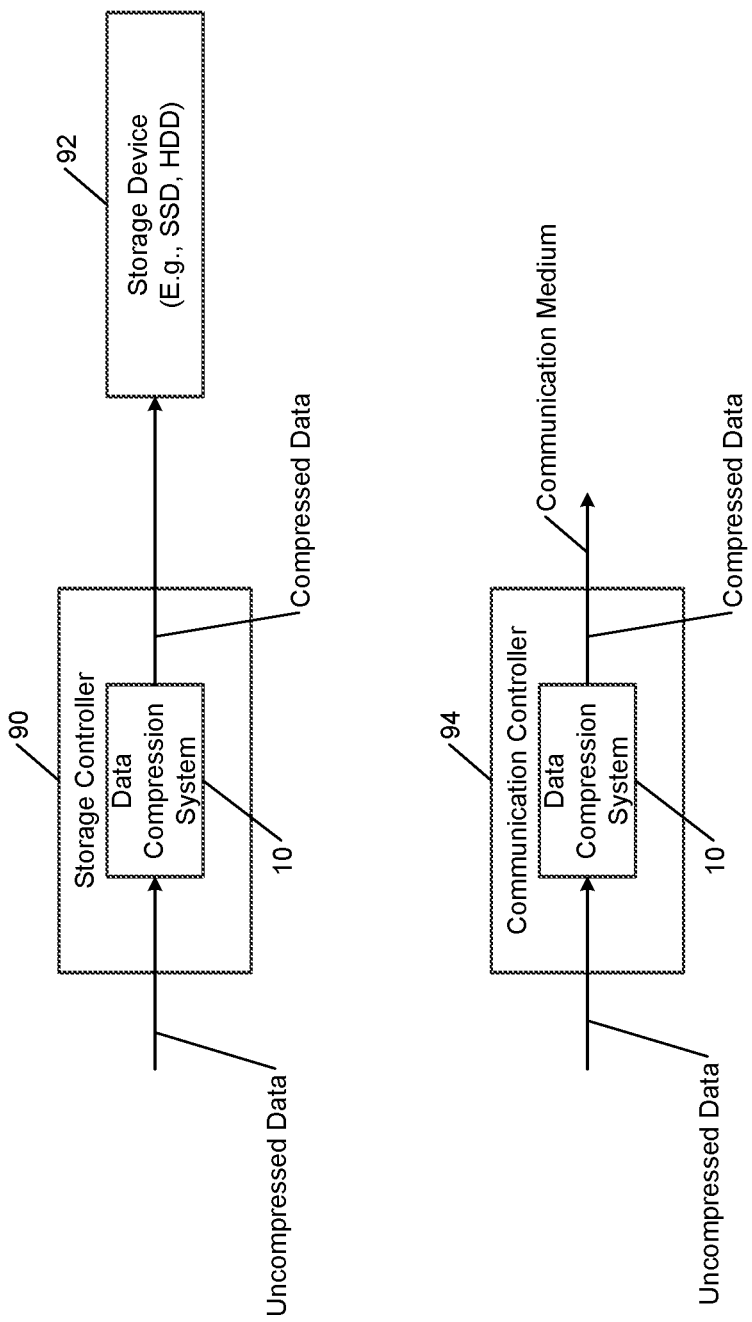
FIG. 6 shows examples of devices in which the data compression system and the data compression method can be implemented.

FIG. 6 shows non-limiting examples of devices in which the data compression system 10 and the data compression method 50 can be implemented. In a first example, the data compression system 10 and the data compression method 50 can be implemented in a storage controller 90 that compresses data according to the present disclosure and that stores the compressed data in a storage device 92. Non-limiting examples of the storage device 92 include a solid-state disk (SSD), a hard disk drive (HDD), etc.

In a second example, the data compression system 10 and the data compression method 50 can be implemented in a communication controller 94 that compresses data according to the present disclosure and that transmits the compressed data over a communication medium. Non-limiting examples of the communication controller 94 include an Ethernet controller (wired or wireless), a fiber-optic controller, and so on.

In other examples, the storage controller 90 may comprise a memory controller, and the storage device 92 may comprise the physical memory (e.g., RAM). In some implementations, the memory controller, the physical memory, and the data compression system 10 may be integrated into a single integrated circuit.

In general, the data compression system 10 and the data compression method 50 can be implemented in any device or component that receives data for storage or that transports data from one point to another via a communication link. Non-limiting examples of such device or component include a wired or wireless interface, an interface such as a computer bus connecting two devices such as a processor and memory, a controller that connects a host or a processor to a peripheral device, and so on.

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure.

Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules) are described using various terms, including "connected," "engaged," "interfaced," and "coupled." Unless explicitly described as being "direct," when a relationship between first and second elements is described in the above disclosure, that relationship encompasses a direct relationship where no other intervening elements are present between the first and second elements, and also an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In the figures, the direction of an arrow, as indicated by the arrowhead, generally demonstrates the flow of information (such as data or instructions) that is of interest to the illustration. For example, when element A and element B exchange a variety of information but information transmitted from element A to element B is relevant to the illustration, the arrow may point from element A to element B. This unidirectional arrow does not imply that no other information is transmitted from element B to element A. Further, for information sent from element A to element B, element B may send requests for, or receipt acknowledgements of, the information to element A.

In this application, including the definitions below, the term "module" or the term "controller" may be replaced with the term "circuit." The term "module" may refer to, be part of, or include processor hardware (shared, dedicated, or group) that executes code and memory hardware (shared, dedicated, or group) that stores code executed by the processor hardware.

The module may include one or more interface circuits. In some examples, the interface circuits may include wired or wireless interfaces that are connected to a local area network (LAN), the Internet, a wide area network (WAN), or combinations thereof. The functionality of any given module of the present disclosure may be distributed among multiple modules that are connected via interface circuits. For example, multiple modules may allow load balancing. In a further example, a server (also known as remote, or cloud) module may accomplish some functionality on behalf of a client module.

The term code, as used above, may include software, firmware, and/or microcode, and may refer to programs, routines, functions, classes, data structures, and/or objects. Shared processor hardware encompasses a single microprocessor that executes some or all code from multiple modules. Group processor hardware encompasses a microprocessor that, in combination with additional microprocessors, executes some or all code from one or more modules. References to multiple microprocessors encompass multiple microprocessors on discrete dies, multiple microprocessors on a single die, multiple cores of a single microprocessor, multiple threads of a single microprocessor, or a combination of the above.

Shared memory hardware encompasses a single memory device that stores some or all code from multiple modules. Group memory hardware encompasses a memory device that, in combination with other memory devices, stores some or all code from one or more modules.

The term memory hardware is a subset of the term computer-readable medium. The term computer-readable medium, as used herein, does not encompass transitory electrical or electromagnetic signals propagating through a medium (such as on a carrier wave); the term computer-readable medium is therefore considered tangible and non-transitory. Non-limiting examples of a non-transitory computer-readable medium are nonvolatile memory devices (such as a flash memory device, an erasable programmable read-only memory device, or a mask read-only memory device), volatile memory devices (such as a static random access memory device or a dynamic random access memory device), magnetic storage media (such as an analog or digital magnetic tape or a hard disk drive), and optical storage media (such as a CD, a DVD, or a Blu-ray Disc).

The apparatuses and methods described in this application may be partially or fully implemented by a special purpose computer created by configuring a general purpose computer to execute one or more particular functions embodied in computer programs. The functional blocks and flowchart elements described above serve as software specifications, which can be translated into the computer programs by the routine work of a skilled technician or programmer.

The computer programs include processor-executable instructions that are stored on at least one non-transitory computer-readable medium. The computer programs may also include or rely on stored data. The computer programs may encompass a basic input/output system (BIOS) that interacts with hardware of the special purpose computer, device drivers that interact with particular devices of the special purpose computer, one or more operating systems, user applications, background services, background applications, etc.

The computer programs may include: (i) descriptive text to be parsed, such as HTML (hypertext markup language), XML (extensible markup language), or JSON (JavaScript Object Notation) (ii) assembly code, (iii) object code generated from source code by a compiler, (iv) source code for execution by an interpreter, (v) source code for compilation and execution by a just-in-time compiler, etc. As examples only, source code may be written using syntax from languages including C, C++, C#, Objective-C, Swift, Haskell, Go, SQL, R, Lisp, Java®, Fortran, Perl, Pascal, Curl, OCaml, Javascript®, HTML5 (Hypertext Markup Language 5th revision), Ada, ASP (Active Server Pages), PHP (PHP: Hypertext Preprocessor), Scala, Eiffel, Smalltalk, Erlang, Ruby, Flash®, Visual Basic®, Lua, MATLAB, SIMULINK, and Python®.

None of the elements recited in the claims are intended to be a means-plus-function element within the meaning of 35 U.S.C. § 112(f) unless an element is expressly recited using the phrase "means for" or, in the case of a method claim, using the phrases "operation for" or "step for."

The invention claimed is:

1. A system comprising:
a computer-readable storage device configured to store computer-executable instructions; and
a processing device configured to execute the computer-executable instructions that, upon execution by the processing device, control the system to:
receive a class of data to be compressed;
select, based on the class of the data and the data, a prefix from a plurality of predetermined prefixes to compress the data;
select, based on the class of the data, the data, and the prefix, a first Huffman table from a plurality of predetermined Huffman tables stored in the storage device to indicate codes associated with compressed data;
compress the data using the prefix to produce intermediate symbols;
select, based on the intermediate symbols, a second Huffman table from the plurality of predetermined Huffman tables;
generate a third Huffman table based on the intermediate symbols;
select the compressed data with a first header including indications of the prefix and the first Huffman table, or the compressed data with a first header including indications of the prefix and the second Huffman table, whichever is smaller in size;
compare a size of the selected compressed data with the first header including indications of the prefix and the first or second Huffman table with a size of the compressed data with a second header including the third Huffman table and an indication of the prefix; and
select, to transmit or to store, the compressed data with the second header when the size of the compressed data with the second header is less than the size of the compressed data with the first header, or the compressed data with the first header when the size of the compressed data with the first header is less than the size of the compressed data with the second header.

2. The system of claim 1 wherein:
the plurality of predetermined prefixes is stored in the storage device;
the prefix is cached in the storage device; and/or
the prefix is fetched externally relative to the system.

3. The system of claim 1 wherein the prefix is compressed.

4. The system of claim 1 wherein the processing device is further configured to execute the computer-executable instructions that, upon execution by the processing device, control the system to select the prefix from the plurality of predetermined prefixes using a neural network algorithm.

5. The system of claim 1 wherein the processing device is further configured to execute the computer-executable instructions that, upon execution by the processing device, control the system to compress the data using a lossless compression algorithm.

6. The system of claim 1 wherein the processing device is further configured to execute the computer-executable instructions that, upon execution by the processing device, control the system to compress the data using LZ77 compression algorithm.

7. A data compression method comprising:
storing a plurality of predetermined prefixes corresponding to a plurality of classes of data in a memory of a compression module;
analyzing data to be compressed;
identifying features of the data;
receiving a class of the data;
selecting, based on the class of the data and the data, a prefix to compress the data from the plurality of predetermined prefixes stored in the memory of the compression module to eliminate an overhead of fetching the prefix;
compressing, using the compression module, the data using the selected prefix to generate compressed data;
generating a header including an indication of the selected prefix used to compress the data; and
outputting, for storage or transmission, the compressed data and the header including the indication of the selected prefix used to compress the data.

8. The data compression method of claim 7 further comprising:
storing a plurality of predetermined Huffman tables corresponding to the plurality of classes of data in the memory of the compression module;
selecting, based on the class of the data, the data, and the selected prefix, a first Huffman table from the plurality of predetermined Huffman tables stored in the memory to indicate codes associated with the compressed data;
selecting, based on intermediate symbols generated by the compression module, a second Huffman table from the plurality of predetermined Huffman tables;
generating a third Huffman table based on the intermediate symbols; and
including in the header the third Huffman table or an indication of the first or second Huffman table, whichever minimizes the size of the compressed data with the header.

9. The data compression method of claim 7 wherein the prefix is compressed.

10. The data compression method of claim 7 further comprising selecting the prefix from the plurality of predetermined prefixes using a neural network algorithm.

11. The data compression method of claim 7 further comprising compressing the data using a lossless compression algorithm.

12. The data compression method of claim 7 further comprising compressing the data using LZ77 compression algorithm.

13. A data compression system comprising:
a memory to store a plurality of predetermined Huffman tables corresponding to a plurality of classes of data;
a classifying module configured to receive data and a class of the data, and to select a Huffman table from the plurality of predetermined Huffman tables based on the class of the data and the data to indicate codes associated with the data after the data is compressed;
a compressing module configured to compress the data; and
a header generating module configured to generate a header including an indication of the Huffman table, and to output the header and the compressed data for storage or transmission,
wherein using the Huffman table from the plurality of predetermined Huffman tables eliminates an overhead of fetching the Huffman table from outside the data compression system.

14. The data compression system of claim 13 wherein:
the memory further stores a plurality of predetermined prefixes corresponding to the plurality of classes of data; and
the classifying module is further configured to select a prefix, from the plurality of predetermined prefixes based on the class of the data and the data, to compress the data.

15. The data compression system of claim 14 wherein the compressing module is configured to compress the data using the prefix and to generate intermediate symbols, the data compression system further comprising:
a processing module configured to select, based on the intermediate symbols, a second Huffman table from the plurality of predetermined Huffman tables.

16. The data compression system of claim 15, wherein the processing module is further configured to:
generate a third Huffman table based on the intermediate symbols; and
output the third Huffman table or an indication of the Huffman table or the second Huffman table to the header generating module, whichever minimizes the size of the compressed data with the header.

17. The data compression system of claim 14 wherein the prefix is compressed.

18. The data compression system of claim 14 wherein the classifying module is further configured to select the prefix from the plurality of predetermined prefixes using a neural network algorithm.

19. The data compression system of claim 13 wherein the compressing module is further configured to compress the data using a lossless compression algorithm.

20. The data compression system of claim 13 wherein the compressing module is further configured to compress the data using LZ77 compression algorithm.

* * * * *